United States Patent
Aoyama et al.

(10) Patent No.: US 8,416,603 B2
(45) Date of Patent: Apr. 9, 2013

(54) NONVOLATILE MEMORY DEVICE

(75) Inventors: Kenji Aoyama, Kanagawa-ken (JP); Kazuhiko Yamamoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 315 days.

(21) Appl. No.: 12/973,064

(22) Filed: Dec. 20, 2010

(65) Prior Publication Data

US 2012/0025159 A1 Feb. 2, 2012

(30) Foreign Application Priority Data

Jul. 29, 2010 (JP) ................................. 2010-170261

(51) Int. Cl.
*G11C 11/00* (2006.01)
*H01L 45/00* (2006.01)

(52) U.S. Cl. ......... 365/148; 257/4; 257/5; 257/E45.001; 977/742

(58) Field of Classification Search ................. 257/2, 4, 257/5, E45.001, E45.002, 528, 529; 365/148; 977/742

See application file for complete search history.

(56) References Cited

U.S. PATENT DOCUMENTS

| 2007/0158697 A1* | 7/2007 | Choi et al. ............... 257/246 |
| 2009/0257266 A1* | 10/2009 | Chen et al. ............... 365/148 |
| 2010/0176488 A1 | 7/2010 | Aoyama |

FOREIGN PATENT DOCUMENTS

JP 2008-34809 2/2008

OTHER PUBLICATIONS

U.S. Appl. No. 13/044,951, filed Mar. 10, 2011, Konno et al.

* cited by examiner

*Primary Examiner* — Calvin Lee
*Assistant Examiner* — Scott Stowe
(74) *Attorney, Agent, or Firm* — Oblon, Spivak, McClelland, Maier & Neustadt, L.L.P.

(57) ABSTRACT

According to one embodiment, a nonvolatile memory device includes a first conductive member and a second conductive member. The first conductive member extends in a first direction. The second conductive member extends in a second direction intersecting the first direction. A portion of the first conductive member connected to the second conductive member protrudes toward the second conductive member. A resistivity of the first conductive member in the first direction is lower than a resistivity of the first conductive member in a third direction of the protrusion of the first conductive member. A resistance value of the first conductive member in the third direction changes. A resistivity of the second conductive member in the second direction is lower than a resistivity of the second conductive member in the third direction. A resistance value of the second conductive member in the third direction changes.

11 Claims, 3 Drawing Sheets

NONVOLATILE MEMORY DEVICE

CROSS-REFERENCE TO RELATED APPLICATIONS

This application is based upon and claims the benefit of priority from the prior Japanese Patent Application No. 2010-170261, filed on Jul. 29, 2010; the entire contents of which are incorporated herein by reference.

FIELD

Embodiments described herein relate generally to a nonvolatile memory device.

BACKGROUND

In recent years, a phenomenon has been discovered in which certain metal oxide materials have two states of a low resistance state and a high resistance state when a voltage is applied due to the resistivity prior to the application of the voltage and the amount of the voltage; and a new nonvolatile memory device utilizing this phenomenon is drawing attention. Such a nonvolatile memory device is referred to as a ReRAM (Resistance Random Access Memory). From the viewpoint of higher integration, a three-dimensional cross-point structure has been proposed as an actual ReRAM device structure in which memory cells include pillars formed at intersections between word lines (WL) and bit lines (BL) and include a resistance change layer and a diode layer stacked in the pillar.

However, while it is necessary to use finer pillars for higher integration of the memory cells, finer pillars have higher aspect ratios; and the formation of the pillars is unfortunately difficult in a ReRAM having such a three-dimensional cross-point structure.

DETAILED DESCRIPTION

In general, according to one embodiment, a nonvolatile memory device includes a first conductive member and a second conductive member. The first conductive member extends in a first direction. The second conductive member extends in a second direction intersecting the first direction. A portion of the first conductive member connected to the second conductive member protrudes toward the second conductive member. A resistivity of the first conductive member in the first direction is lower than a resistivity of the first conductive member in a third direction of the protrusion of the first conductive member. A resistance value of the first conductive member in the third direction changes. A resistivity of the second conductive member in the second direction is lower than a resistivity of the second conductive member in the third direction. A resistance value of the second conductive member in the third direction changes.

According to another embodiment, a nonvolatile memory device includes a first conductive member, a second interconnect layer, a first insulating member, and a second insulating member. The first conductive member is stacked alternately with the second conductive member. The first insulating member extends in a first direction orthogonal to a stacking direction of the first conductive member and the second conductive member. The first insulating member divides the first conductive member and an upper portion of the second conductive member. The second insulating member extends in a second direction intersecting the first direction and orthogonal to the stacking direction. The second insulating member divides the second conductive member and an upper portion of the first conductive member. A resistivity of the first conductive member in the first direction is lower than a resistivity of the first conductive member in the stacking direction. A resistance value of the first conductive member in the stacking direction changes. A resistivity of the second conductive member in the second direction is lower than a resistivity of the second conductive member in the stacking direction. A resistance value of the second conductive member in the stacking direction changes.

Embodiments of the invention will now be described with reference to the drawings.

Figure 1:
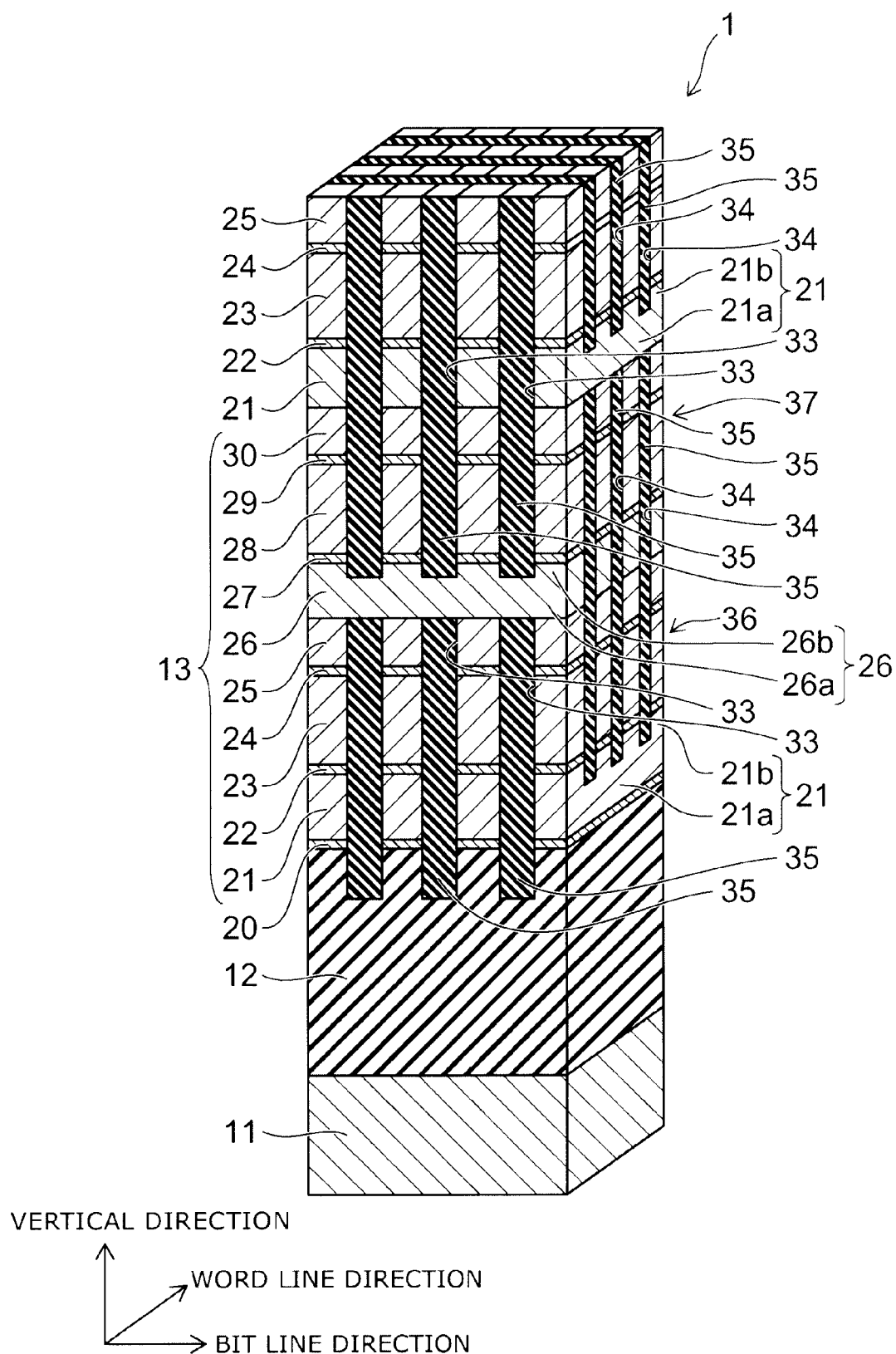
FIG. 1 is a perspective view illustrating a nonvolatile memory device according to an embodiment.

FIG. 1 is a perspective view illustrating the nonvolatile memory device according to this embodiment.

Figure 2:
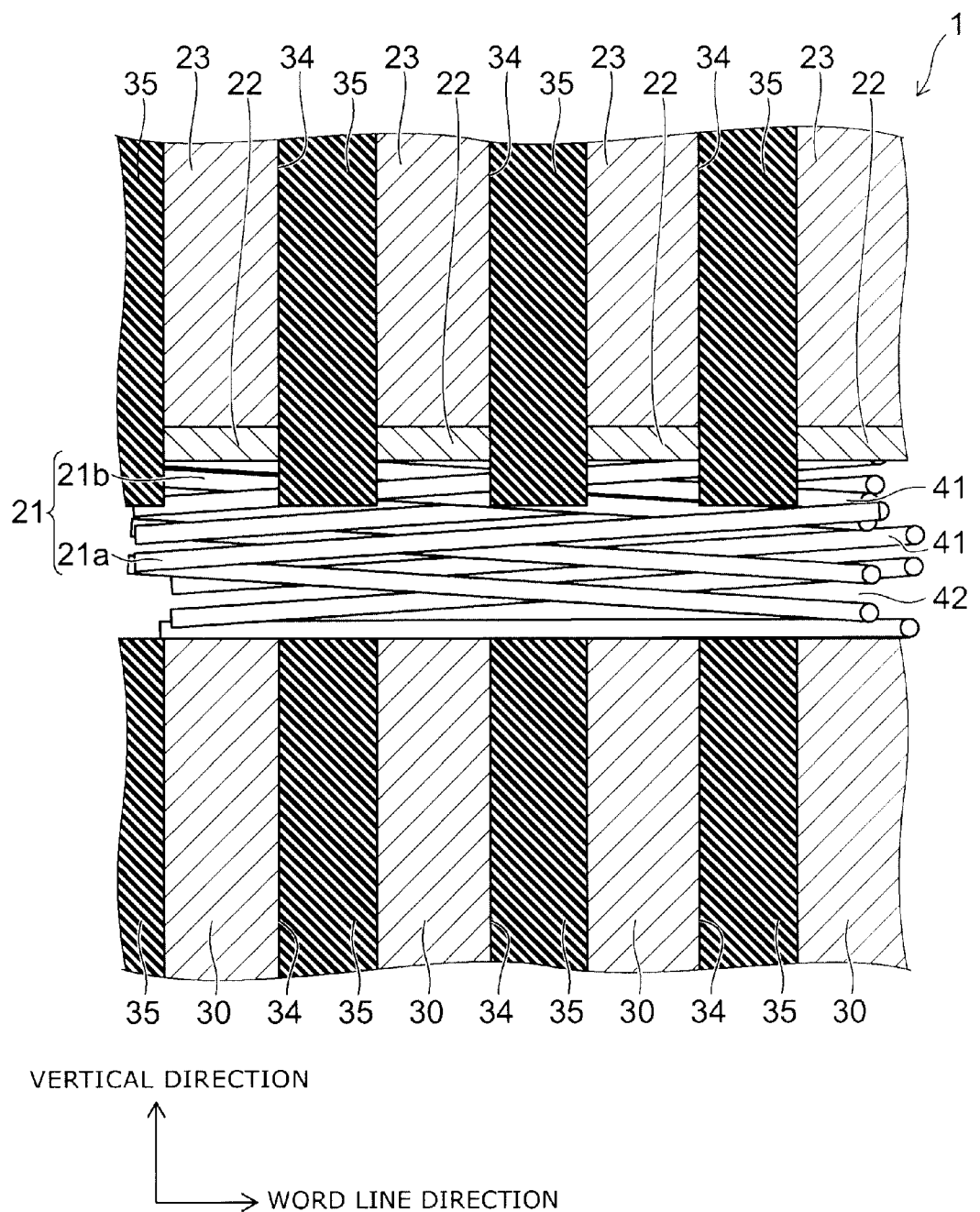
FIG. 2 is a cross-sectional view schematically illustrating a word line member and a periphery of the word line member of the nonvolatile memory device according to the embodiment.

FIG. 2 is a cross-sectional view schematically illustrating a word line member and a periphery of the word line member of the nonvolatile memory device according to this embodiment.

As illustrated in FIG. 1, a silicon substrate 11 is provided in the nonvolatile memory device 1 according to this embodiment; and a drive circuit (not illustrated) of the nonvolatile memory device 1 is formed in the upper layer portion and on the upper face of the silicon substrate 11. An inter-layer insulating film 12 made of, for example, silicon oxide is provided on the silicon substrate 11 to bury the drive circuit.

A barrier metal layer 20, a word line member 21, a barrier metal layer 22, a silicon diode layer 23, a barrier metal layer 24, a stopper layer 25, a bit line member 26, a barrier metal layer 27, a silicon diode layer 28, a barrier metal layer 29, and a stopper layer 30 are stacked on the inter-layer insulating film 12 in this order from the lower layer side. A unit stacked body 13 is formed of the stacked body from the word line member 21 to the stopper layer 30; and multiple levels of the unit stacked body 13 are stacked on the barrier metal layer 20. For convenience of description in FIG. 1, only one and one-half level of the unit stacked bodies 13 are illustrated.

Multiple trenches 33 extending in one direction are made parallel to each other at equal spacing in a portion from the upper portion of the inter-layer insulating film 12 to the stopper layer 25 of the unit stacked body 13 of the first level from the bottom and in a portion from an upper portion 26b of the bit line member 26 of the unit stacked body 13 of the first level to the stopper layer 25 of the unit stacked body 13 of the level thereon, that is, the second level from the bottom. Hereinbelow, the direction in which the trench 33 extends is referred to as the "word line direction." Multiple trenches 34 that extend in a direction intersecting the word line direction, e.g., orthogonal thereto, and are parallel to each other at equal spacing are made in a portion from an upper portion 21b of the word line member 21 of the unit stacked body 13 of the first level to the stopper layer 30 of the unit stacked body 13 of the first level. Hereinbelow, the direction in which the trench 34 extends is referred to as the "bit line direction." A direction orthogonal to both the word line direction and the bit line direction, i.e., the stacking direction of the layers described above, is referred to as the "vertical direction." An insulating member is formed by filling an insulating material 35 such as, for example, silicon oxide into the trench 33 and into the trench 34.

The trench 33 and the trench 34 are made similarly in the unit stacked bodies 13 of the second level from the bottom and higher. In other words, the portion of each of the unit stacked bodies 13 other than a lower portion 26a of the bit line member 26 is divided by the trenches 33 extending in the word line direction; and the portion other than a lower portion 21a of the word line member 21 is divided by the trenches 34 extending in the bit line direction. Thereby, the upper portion 21b of the word line member 21, the barrier metal layer 22, the silicon diode layer 23, the barrier metal layer 24, and the stopper layer 25 of each of the unit stacked bodies 13 are divided by both the trench 33 and the trench 34 to form multiple pillars 36 arranged in a matrix configuration along both the word line direction and the bit line direction. Similarly, the upper portion 26b of the bit line member 26, the barrier metal layer 27, the silicon diode layer 28, the barrier metal layer 29, and the stopper layer 30 also are divided by both the trench 33 and the trench 34 to form multiple pillars 37 arranged in a matrix configuration along both the word line direction and the bit line direction.

On the other hand, the lower portion 21a of the word line member 21 is divided by the trenches 33 but is not divided by the trenches 34 and extends in the word line direction. The upper portion 21b of the word line member 21 protrudes upward from the lower portion 21a, that is, toward the bit line member 26. The lower portion 26a of the bit line member 26 is divided by the trenches 34 but is not divided by the trenches 33 and extends in the bit line direction. The upper portion 26b of the bit line member 26 protrudes upward from the lower portion 26a, that is, toward the word line member 21.

The barrier metal layers 20, 22, 24, 27, and 29 are formed of, for example, titanium nitride (TiN), tantalum nitride (TaN), or tungsten nitride (WN) and are layers that suppress the diffusion of the materials and increase the adhesion between each of the layers. The silicon diode layers 23 and 28 are formed of, for example, polysilicon. The silicon diode layer 23 includes an n-type layer having an n$^+$-type conductivity, an i-type layer made of an intrinsic semiconductor, and a p-type layer having a p$^+$-type conductivity stacked in this order from the lower layer side. On the other hand, the silicon diode layer 28 includes a p-type layer, an i-type layer, and an n-type layer stacked in this order from the lower layer side. Thereby, the silicon diode layers 23 and 28 function as selection element layers that allow current to flow in the case where the potential of the bit line member 26 is higher than the potential of the word line member 21 and do not allow current to flow in the reverse directions. The stopper layers 25 and 30 are formed of, for example, tungsten (W), tungsten nitride (WN), or titanium nitride (TiN) and are are layers that form stoppers of CMP (chemical mechanical polishing) when forming the unit stacked body 13.

As illustrated in FIG. 1 and FIG. 2, the word line member 21 and the bit line member 26 are formed of a nanomaterial aggregate body including a gap 42 interposed between loosely aggregated carbon nanotubes (CNTs) 41, i.e., micro conductive bodies. Each of the CNTs 41 can move in a micro range in the interiors of the word line member 21 and the bit line member 26. For example, the position and the orientation of a certain CNT 41 can be changed in the space surrounded by the surrounding CNTs. The gap 42 is, for example, a gaseous layer including nitrogen gas ($N_2$) or hydrogen gas ($H_2$). The widths of the word line member 21 and the bit line member 26 are, for example, 24 nm; and the heights are, for example, 200 nm. The configuration of each of the CNTs 41 is a tubular configuration extending in one direction. The diameter of the CNT 41 is, for example, 1 to 2 nm; and the length thereof is, for example, 20 nm to 1 μm.

In the word line member 21, the number of the CNTs 41 extending in the word line direction is greater than the number of the CNTs 41 extending in the vertical direction. More specifically, the CNTs 41 in the word line member 21 extend substantially in the horizontal direction, i.e., a direction parallel to the plane including the word line direction and the bit line direction, and do not extend in the vertical direction. At least a portion of the CNTs 41 extends in the word line direction. For example, the word line member 21 is made of multiple layers stacked in the vertical direction; and the directions in which the CNTs 41 extend in each of the layers are aligned in one horizontal direction; and the CNTs 41 extend substantially in the word line direction in at least one of the layers. Therefore, the number of the contact points between the CNTs 41 per unit length in the word line member 21 is relatively low in the word line direction and relatively high in the vertical direction.

The resistivity in the axial direction of the CNT 41 is, for example, not more than 1 μΩ·cm (micro-ohm centimeter). Conversely, the contact resistance between the CNTs 41 is about, for example, 1 kΩ (kilo-ohm) per location, and is much larger than the resistivity in the axial direction. Therefore, the resistivity of the word line member 21 increases as the number of the contact points between the CNTs 41 per unit length increases. Accordingly, the resistivity of the word line member 21 in the word line direction is lower than the resistivity in the vertical direction.

The word line member 21 can have two states of a "high resistance state" and a "low resistance state" by the resistance value changing in the vertical direction. The mechanism, while not completely elucidated, is considered to be, for example, as follows. When a voltage is not applied in the vertical direction in the word line member 21, the CNTs 41 are roughly in a state of being isolated from each other; and the word line member 21 is in the "high resistance state." On the other hand, when a voltage is applied in the vertical direction, Coulomb forces occur between the CNTs 41; and the CNTs 41 attract each other. Then, when the voltage is continuously applied for at least a constant amount of time, the CNTs 41 move and rotate due to the Coulomb forces and contact adjacent CNTs 41; and a current path is formed in the word line member 21 via the multiple CNTs 41. As a result, the word line member 21 is switched to the "low resistance state." This state is maintained even when the voltage is no longer applied in the vertical direction. When a short pulse voltage, e.g., on the order of nanoseconds, is applied in the vertical direction, the contact portions between the CNTs 41 generate heat; and the CNTs 41 separate from each other. As a result, the word line member 21 returns to the "high resistance state."

Similarly in the bit line member 26, the number of the CNTs 41 extending in the bit line direction is greater than the number of the CNTs 41 extending in the vertical direction. More specifically, the CNTs 41 do not extend in the vertical direction and extend substantially in a horizontal direction. At least a portion of the CNTs 41 extends in the bit line direction. For example, the bit line member 26 is made of multiple layers stacked in the vertical direction; the directions in which the CNTs 41 extend in each of the layers are substantially aligned in one horizontal direction; and the CNTs 41 extend substantially in the bit line direction in at least one of the layers. Therefore, the resistivity of the bit line member 26 in the bit line direction is lower than the resistivity in the vertical direction. Similarly to the word line member 21, the bit line member 26 also has the two states of the "high resistance state" and the "low resistance state" due to the resistance value changing in the vertical direction.

By such a configuration, the lower portion 21a of the word line member 21 functions as an interconnect extending in the word line direction. The lower portion 26a of the bit line member 26 functions as an interconnect extending in the bit line direction. The upper portion 21b of the word line member 21 and the upper portion 26b of the bit line member 26 can have the two states of the "high resistance state" and the "low resistance state" in the vertical direction and thereby function as storage layers capable of storing binary data.

In the nonvolatile memory device 1, a three-dimensional cross-point structure is realized in which the word line interconnect layer, which includes the multiple word line members 21 disposed at the same vertical-direction position, is stacked alternately with the bit line interconnect layer, which includes the multiple bit line members 26 disposed at the same vertical-direction position; and the pillars 36 and 37 are formed between each of the word line members 21 and each of the bit line members 26. In each of the pillars 36 and 37, the silicon diode layer 23 or 28, which is used as the selection element layer, and the upper portion 21b of the word line member 21 or the upper portion 26b of the bit line member 26, which is used as the storage layer, are stacked in the vertical direction.

A method for manufacturing the nonvolatile memory device according to this embodiment will now be described with reference to FIG. 1.

First, the silicon substrate 11 is prepared. The silicon substrate 11 is, for example, a portion of a silicon wafer. Then, a drive circuit (not illustrated) is formed on the upper face of the silicon substrate 11. Continuing, the inter-layer insulating film 12 is formed on the silicon substrate 11. Then, the barrier metal layer 20 is formed by depositing, for example, titanium nitride (TiN), tantalum nitride (TaN), or tungsten nitride (WN) using sputtering.

Then, a nanomaterial containing many carbon nanotubes (CNTs) is prepared. The nanomaterial may include, for example, a CNT dispersion solution of CNTs dispersed in water. Then, the CNT dispersion solution is coated onto the barrier metal layer 20 using, for example, spin coating. The CNT dispersion solution also may be dispersed onto the barrier metal layer 20 by spraying. Subsequently, the CNT dispersion solution coated onto the barrier metal layer 20 is dried. At this time, the direction in which the CNTs 41 extend approaches a horizontal direction in the process of the CNT dispersion solution being dried and the thickness being reduced. Thereby, a thin nanomaterial aggregate layer is formed on the upper face of the barrier metal layer 20. In the nanomaterial aggregate layer, the multiple CNTs 41 extending in the horizontal direction (referring to FIG. 2) are loosely aggregated; and the gap 42 (referring to FIG. 2) is formed between the CNTs 41.

By using a CNT dispersion solution having a low impurity concentration in this process, the axial directions of the CNTs 41 included in the nanomaterial aggregate layer are aligned in one direction. It is considered that this is because the OH groups bonded to the surfaces of the CNTs 41 repel each other. Then, by repeatedly coating and drying the CNT dispersion solution described above multiple times, e.g., about 15 times, multiple layers of thin nanomaterial aggregate layers are stacked to form the word line member 21. Of the multiple layers of the nanomaterial aggregate layers included in the word line member 21, the CNTs 41 of at least one of the nanomaterial aggregate layers extend substantially in the word line direction. Further, there are no CNTs 41 piercing the word line member 21 in the vertical direction. At this stage, the word line member 21 is not divided and is a continuous film.

Then, the barrier metal layer 22 is formed on the word line member 21 using, for example, sputtering; the silicon diode layer 23 is formed using, for example, CVD (chemical vapor deposition); and the barrier metal layer 24 and the stopper layer 25 are formed as films in this order using, for example, sputtering. Continuing, a hard mask (not illustrated) is formed as a film on the stopper layer 25 by depositing, for example, silicon oxide. Then, the hard mask is patterned into a line-and-space (L/S) configuration extending in the word line direction using lithography.

Continuing, the stopper layer 25, the barrier metal layer 24, the silicon diode layer 23, the barrier metal layer 22, the word line member 21, the barrier metal layer 20, and the upper portion of the inter-layer insulating film 12 are selectively removed by performing anisotropic etching such as RIE (reactive ion etching) using the hard mask as a mask. Thereby, the multiple trenches 33 extending in the word line direction are made in the portion from the stopper layer 25 to the upper portion of the inter-layer insulating film 12. The trenches 33 divide the stopper layer 25, the barrier metal layer 24, the silicon diode layer 23, the barrier metal layer 22, the word line member 21, and the barrier metal layer 20 into the multiple line portions extending in the word line direction.

Then, the insulating material 35 such as, for example, silicon oxide is deposited on the entire surface. The insulating material 35 is filled into the trenches 33 and is deposited also on the upper face of the stopper layer 25. Then, the upper face of the stopper layer 25 is exposed by performing CMP using the stopper layer 25 as a stopper. At this time, the insulating material 35 remains in the trenches 33.

Continuing, the bit line member 26 is formed on the stopper layer 25 by repeatedly coating and drying the CNT dispersion solution. The formation method of the bit line member 26 is similar to the formation method of the word line member 21. Of the multiple nanomaterial aggregate layers included in the bit line member 26, the CNTs 41 of at least one layer extend substantially in the bit line direction.

Then, the barrier metal layer 27 is formed on the bit line member 26 using, for example, sputtering; the silicon diode layer 28 is formed using, for example, CVD; and the barrier metal layer 29 and the stopper layer 30 are formed in this order as films using, for example, sputtering. At this stage, all of the layers included in the unit stacked body 13 of the first level are formed as films. Continuing, a hard mask (not illustrated) for patterning is formed as a film on the stopper layer 30 by depositing, for example, silicon oxide. Then, the hard mask is patterned into a line-and-space (L/S) configuration extending in the bit line direction using lithography.

Continuing, the stopper layer 30, the barrier metal layer 29, the silicon diode layer 28, the barrier metal layer 27, the bit line member 26, the stopper layer 25, the barrier metal layer 24, the silicon diode layer 23, the barrier metal layer 22, and the upper portion 21b of the word line member 21 are selectively removed by performing the anisotropic etching such as RIE using the hard mask as a mask. Thereby, the multiple trenches 34 extending in the bit line direction are made in the portion from the stopper layer 30 to the upper portion 21b of the word line member 21. Thereby, the trenches 34 divide the portion from the stopper layer 30 to the upper portion 21b of the word line member 21 into multiple lines extending in the bit line direction. The pillars 36 arranged in a matrix configuration are formed because the portion from the stopper layer 25 to the upper portion 21b of the word line member 21 already is divided by the trenches 33. On the other hand, the lower portion 21a of the word line member 21 is not divided by the trenches 34 and forms interconnects extending in the word line direction.

Then, the insulating material 35 is deposited on the entire surface. The insulating material 35 is filled into the trenches 34 and is deposited also on the upper face of the stopper layer 30. Continuing, the upper face of the stopper layer 30 is exposed by performing CMP using the stopper layer 30 as a stopper. At this time, the insulating material 35 remains in the trenches 34.

Continuing, methods similar to those described above are used to form the lower layer portion of the unit stacked body 13 of the second level, that is, the word line member 21, the barrier metal layer 22, the silicon diode layer 23, the barrier metal layer 24, and the stopper layer 25 in this order, as films on the stopper layer 30. Then, a hard mask having a L/S configuration extending in the word line direction is formed; and the trenches 33 are made in the portion from the stopper layer 25 of the unit stacked body 13 of the second level to the upper portion 26b of the bit line member 26 of the first level by performing RIE using the hard mask as a mask. Thereby, this portion is divided by the trenches 33. The pillars 37 arranged in a matrix configuration are formed because the portion of the unit stacked body 13 of the first level from the stopper layer 30 to the upper portion 26b of the bit line member 26 already is divided by the trenches 34. On the other hand, the lower portion 26a of the bit line member 26 is not divided by the trenches 33 and forms interconnects extending in the bit line direction. Then, the insulating material 35 is deposited; and the insulating material 35 is filled into the trenches 33 by performing CMP using the stopper layer 30 as a mask.

Then, the upper layer portion of the unit stacked body 13 of the second level, i.e., the bit line member 26, the barrier metal layer 27, the silicon diode layer 28, the barrier metal layer 29, and the stopper layer 30, is formed as films; the trenches 34 are made in the portion of the unit stacked body 13 of the second level from the stopper layer 30 to the upper portion 26b of the bit line member 26 using RIE; and the insulating material 35 is filled into the trenches 34.

Similarly thereafter, the film formation of the lower layer portion of the unit stacked body 13, the making of the trenches 33, the filling of the insulating material 35, the film formation of the upper layer portion of the unit stacked body 13, the making of the trenches 34, and the filling of the insulating material 35 are implemented repeatedly to construct a three-dimensional cross-point structural body. Thereby, the nonvolatile memory device 1 is manufactured.

Operational effects of this embodiment will now be described.

According to this embodiment, the word line member 21 can realize both the interconnect extending in the word line direction and the recording layer. In other words, the lower portion 21a of the word line member 21 functions as an interconnect (a word line) allowing current to flow in the word line direction; and the upper portion 21b protruding upward functions as a resistance change layer due to the CNTs 41. Similarly, the bit line member 26 can realize both the interconnect extending in the bit line direction and the recording layer. In other words, the lower portion 26a of the bit line member 26 functions as an interconnect (a bit line) allowing current to flow in the bit line direction; and the upper portion 26b protruding upward functions as a resistance change layer due to the CNTs 41. Thereby, it is unnecessary to form barrier metal layers between the word line and the resistance change layer and between the bit line and the resistance change layer; and the heights of the pillars 36 and 37 can be reduced. As a result, the aspect ratios of the pillars 36 and 37 can be kept low even in the case where the pillars 36 and 37 are finer to increase the integration of the memory cells; and the formation of the pillars 36 and 37 is easy.

Also, according to this embodiment, the number of processes can be reduced compared to the case where barrier metal layers are formed between the word line and the resistance change layer and between the bit line and the resistance change layer. Thereby, the manufacturing cost of the nonvolatile memory device 1 can be reduced.

Further, in this embodiment, the interconnects are formed of CNTs (carbon nanotubes). Generally, the resistivity of a CNT is lower than the resistivity of a metal. For example, while the resistivity of tungsten is about 5 $\mu\Omega\cdot cm$, the resistivity of a CNT is not more than 1 $\mu\Omega\cdot cm$. Therefore, according to this embodiment, it is possible for the interconnect portions, i.e., the lower portion 21a of the word line member 21 and the lower portion 26a of the bit line member 26, to be thinner than those of the case where the interconnects are formed of a metal material such as tungsten. For this reason as well, the heights of the pillars 36 and 37 can be reduced; and the aspect ratios can be reduced.

A comparative example of this embodiment will now be described.

Figure 3:
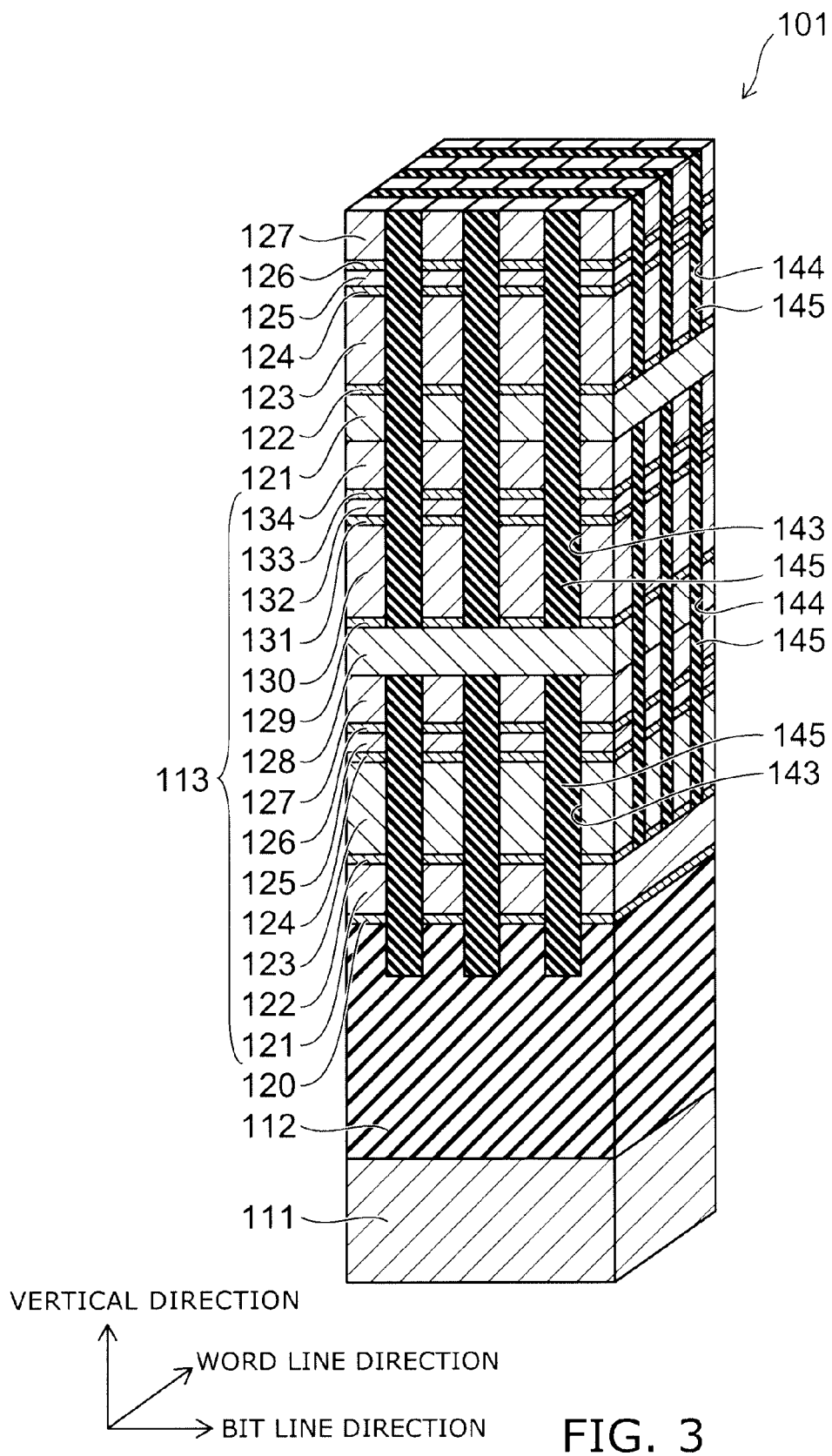
FIG. 3 is a perspective view illustrating a nonvolatile memory device according to a comparative example.

FIG. 3 is a perspective view illustrating a nonvolatile memory device according to this comparative example.

In the nonvolatile memory device 101 according to this comparative example as illustrated in FIG. 3, an inter-layer insulating film 112 and a barrier metal layer 120 are provided on a silicon substrate 111; and multiple levels of a unit stacked body 113 are provided thereon.

In each of the unit stacked bodies 113, a word line 121, a barrier metal layer 122, a silicon diode layer 123, a barrier metal layer 124, a nanomaterial aggregate layer 125, a barrier metal layer 126, a stopper layer 127, a bit line 128, a barrier metal layer 129, a silicon diode layer 130, a barrier metal layer 131, a nanomaterial aggregate layer 132, a barrier metal layer 133, and a stopper layer 134 are stacked in this order from the lower layer side. The nanomaterial aggregate layers 125 and 132 are layers of loosely aggregated CNTs and are resistance change layers. The word line 121 and the bit line 128 are formed of a metal material such as, for example, tungsten. Trenches 143 extending in the word line direction are made in the portion of each of the unit stacked bodies 113 other than the bit line 128; trenches 144 extending in the bit line direction are made in the portion other than the word line 121; and an insulating material 145 is filled into the interiors of the trench 143 and the trench 144.

Thus, in the nonvolatile memory device 101 according to this comparative example, one unit stacked body 113 includes the six layers of the barrier metal layers 122, 124, 126, 129, 131, and 133. Conversely, in the nonvolatile memory device 1 according to the embodiment described above (referring to FIG. 1), the number of barrier metal layers included in one unit stacked body 13 is the four layers of the barrier metal layers 22, 24, 27, and 29. Therefore, the height of the pillar in the nonvolatile memory device 101 according to this comparative example is higher than that of the nonvolatile memory device 1 according to this embodiment by the amount of the increased number of barrier metal layers. Accordingly, the aspect ratio undesirably increases as the pillars are made finer; and patterning becomes difficult. For example, the pillars undesirably collapse when etching. Moreover, the number of processes to form the barrier metal layers increases; and the manufacturing costs undesirably increase.

Although an example is illustrated in the embodiments described above in which each of the word line member 21 and the bit line member 26 is a stacked body made of multiple nanomaterial aggregate layers, the invention is not limited thereto. Each of the word line member 21 and the bit line member 26 may be a single nanomaterial aggregate layer.

Although an example is illustrated in the embodiments described above in which carbon nanotubes (CNTs) are used as the micro conductive bodies included in the word line member 21 and the bit line member 26, the invention is not limited thereto. The micro conductive body may be a carbon nanomaterial other than a CNT such as, for example, a graphene nanoribbon; and the micro conductive body may be a nanomaterial made of a conductive material other than carbon such as a silicon nanotube. Or, the micro conductive body may be a nanostructural body material having a nanoscale crystalline structure; and the micro conductive body may be a carbon film and the like including such a nanostructural body material.

Further, although an example is illustrated in the embodiments described above in which the word line member 21 and the bit line member 26 include nanomaterial aggregate layers in which micro conductive bodies are aggregated, the invention is not limited thereto. It is sufficient to use a material in which the resistivity in one direction is lower than the resistivity in one other direction and the resistance value changes in the one other direction.

Furthermore, although an example is illustrated in the embodiments described above in which the pin-type silicon diode layers 23 and 28 are provided as the selection element layers, the invention is not limited thereto. It is sufficient for the selection element layer to be a layer that controls the amount of current flowing between the word line member 21 and the bit line member 26 based on the voltage between the word line member 21 and the bit line member 26.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

According to the embodiments described above, a nonvolatile memory device having a low pillar aspect ratio can be realized.

The invention claimed is:

1. A nonvolatile memory device, comprising:
a first conductive member extending in a first direction; and
a second conductive member extending in a second direction intersecting the first direction,
a portion of the first conductive member connected to the second conductive member protruding toward the second conductive member,
a resistivity of the first conductive member in the first direction being lower than a resistivity of the first conductive member in a third direction of the protrusion of the first conductive member, a resistance value of the first conductive member in the third direction changing, and
a resistivity of the second conductive member in the second direction being lower than a resistivity of the second conductive member in the third direction, a resistance value of the second conductive member in the third direction changing.

2. The device according to claim 1, wherein:
the first conductive member and the second conductive member are made of a nanomaterial including an aggregation of a plurality of micro conductive bodies extending in one direction;
the number of the micro conductive bodies extending in the first direction is greater than the number of the micro conductive bodies extending in the third direction in the first conductive member; and
the number of the micro conductive bodies extending in the second direction is greater than the number of the micro conductive bodies extending in the third direction in the second conductive member.

3. The device according to claim 2, wherein:
the first conductive member has a plurality of layers stacked in the third direction, and the second conductive member has a plurality of layers stacked in the third direction;
extension directions of the micro conductive bodies are mutually the same within each of the layers;
the micro conductive bodies extend in the first direction in at least one layer of the plurality of layers of the first conductive member; and
the micro conductive bodies extend in the second direction in at least one layer of the plurality of layers of the second conductive member.

4. The device according to claim 2, wherein the micro conductive body is a carbon nanotube.

5. The device according to claim 1, wherein:
a first interconnect layer including a plurality of the first conductive members is stacked alternately with a second interconnect layer including a plurality of the second conductive members; and
a portion of the second conductive member connected to the first conductive member protrudes toward the third direction.

6. The device according to claim 5, further comprising a selection element layer controlling an amount of current flowing between the first conductive member and the second conductive member based on a voltage between the first conductive member and the second conductive member,
the selection element layer being a portion of a pillar provided between each of the first conductive members and each of the second conductive members.

7. A nonvolatile memory device, comprising:
a first conductive member stacked alternately with a second conductive member;
a first insulating member extending in a first direction orthogonal to a stacking direction of the first conductive member and the second conductive member, the first insulating member dividing the first conductive member and an upper portion of the second conductive member; and
a second insulating member extending in a second direction intersecting the first direction and orthogonal to the stacking direction, the second insulating member dividing the second conductive member and an upper portion of the first conductive member,
a resistivity of the first conductive member in the first direction being lower than a resistivity of the first conductive member in the stacking direction, a resistance value of the first conductive member in the stacking direction changing, and a resistivity of the second conductive member in the second direction being lower than a resistivity of the second conductive member in the stacking direction, a resistance value of the second conductive member in the stacking direction changing.

8. The device according to claim 7, wherein:

the first conductive member and the second conductive member are made of a nanomaterial including an aggregation of a plurality of micro conductive bodies extending in one direction;

the number of the micro conductive bodies extending in the first direction is greater than the number of the micro conductive bodies extending in the stacking direction in the first conductive member; and the number of the micro conductive bodies extending in the second direction is greater than the number of the micro conductive bodies extending in the stacking direction in the second conductive member.

9. The device according to claim 8, wherein:

the first conductive member has a plurality of layers stacked in the stacking direction, and the second conductive member has a plurality of layers stacked in the stacking direction;

extension directions of the micro conductive bodies are mutually the same within each of the layers;

the micro conductive bodies extend in the first direction in at least one layer of the plurality of layers of the first conductive member; and the micro conductive bodies extend in the second direction in at least one layer of the plurality of layers of the second conductive member.

10. The device according to claim 8, wherein the micro conductive body is a carbon nanotube.

11. The device according to claim 7, further comprising a selection element layer controlling an amount of current flowing between the first conductive member and the second conductive member based on a voltage between the first conductive member and the second conductive member, the selection element layer being divided by the first insulating member and the second insulating member.

* * * * *